United States Patent
Parmon

(10) Patent No.: US 9,190,708 B2
(45) Date of Patent: Nov. 17, 2015

(54) SYSTEM FOR REDUCING ELECTROMAGNETIC INDUCTION INTERFERENCE

(71) Applicant: Walter Parmon, Chandler, AZ (US)

(72) Inventor: Walter Parmon, Chandler, AZ (US)

(73) Assignee: Freescale Semiconductors, Inc., Austin, TX (US)

( * ) Notice: Subject to any disclaimer, the term of this patent is extended or adjusted under 35 U.S.C. 154(b) by 261 days.

(21) Appl. No.: 13/785,482

(22) Filed: Mar. 5, 2013

(65) Prior Publication Data

US 2014/0253258 A1     Sep. 11, 2014

(51) Int. Cl.
| | |
|---|---|
| *H04B 3/28* | (2006.01) |
| *H01P 11/00* | (2006.01) |
| *H01P 1/20* | (2006.01) |
| *H05K 1/02* | (2006.01) |

(52) U.S. Cl.
CPC ............... *H01P 11/007* (2013.01); *H01P 1/20* (2013.01); *H01P 1/2005* (2013.01); *H05K 1/0236* (2013.01)

(58) Field of Classification Search
CPC .......... H01Q 13/10; H01P 11/007; H01P 1/20
USPC .................................................. 333/12, 202
See application file for complete search history.

(56) References Cited

U.S. PATENT DOCUMENTS

| | | |
|---|---|---|
| 6,262,495 B1 | 7/2001 | Yablonovitch et al. |
| 6,906,674 B2 * | 6/2005 | McKinzie et al. ............ 343/767 |
| 6,933,812 B2 | 8/2005 | Sarabandi et al. |
| 7,215,007 B2 | 5/2007 | McKinzie, III et al. |
| 8,816,798 B2 * | 8/2014 | McKinzie, III ............... 333/251 |
| 2004/0239451 A1 * | 12/2004 | Ramprasad et al. .......... 333/202 |
| 2007/0215843 A1 | 9/2007 | Soukoulis et al. |

FOREIGN PATENT DOCUMENTS

| | | | | |
|---|---|---|---|---|
| KR | 1020100034236 | * | 4/2010 | ............... H05K 1/02 |
| KR | 100965264 B1 | * | 6/2010 | ............... H05K 1/02 |

OTHER PUBLICATIONS

Jinwoo Choi; Vinu Govind; and Madhavan Swaminathan. "A Novel Electromagnetic Bandgap (EBG) Structure for Mixed-Signal System Applications." School of Electrical and Computer Engineering, Georgia Institute of Technology, pp. 243-246, Atlanta, Georgia.

(Continued)

*Primary Examiner* — Sibin Chen
*Assistant Examiner* — Metasebia Retebo

(57) ABSTRACT

An electromagnetic band gap device is provided, comprising: a conductive plane; a non-conductive substrate located over the conductive plane; and an electromagnetic band gap unit cell that includes a first via located in the non-conductive substrate and filled with a conductive material, a second via located in the non-conductive substrate and filled with the conductive material, a first conductive surface located on the non-conductive substrate over the first via, and a second conductive surface located on the non-conductive substrate over the second via, wherein the electromagnetic band gap unit cell is configured to operate as an LC resonant circuit in conjunction with the conductive plane, at least one gap is located in the electromagnetic band gap unit cell, the at least one gap being located in the first via, in the first conductive surface, in the second conductive surface, and in the second via.

25 Claims, 7 Drawing Sheets

(56) References Cited

OTHER PUBLICATIONS

Hamada Elsaied and Maher M. Abd Elrazzak. "Novel Planar Microstrip Low Pass Filters Usine Electromagnetic Band Gap (EBG) Structures." Middle East Conference on Antennas and Propagation (MECAP), Oct. 2010. Cairo, Egypt.

Mingchun Tang; Shaoqiu Xiao; Tianwei Deng; and Bingzhong Wang. "Novel folded single split ring resonator and its application to eliminate scan blindness in infinite phased array," Signals Systems and Electronics (ISSSE), 2010 International Symposium on Signals, Systems and Electronics, vol. 1, pp. 1-4, Sep. 2010.

* cited by examiner

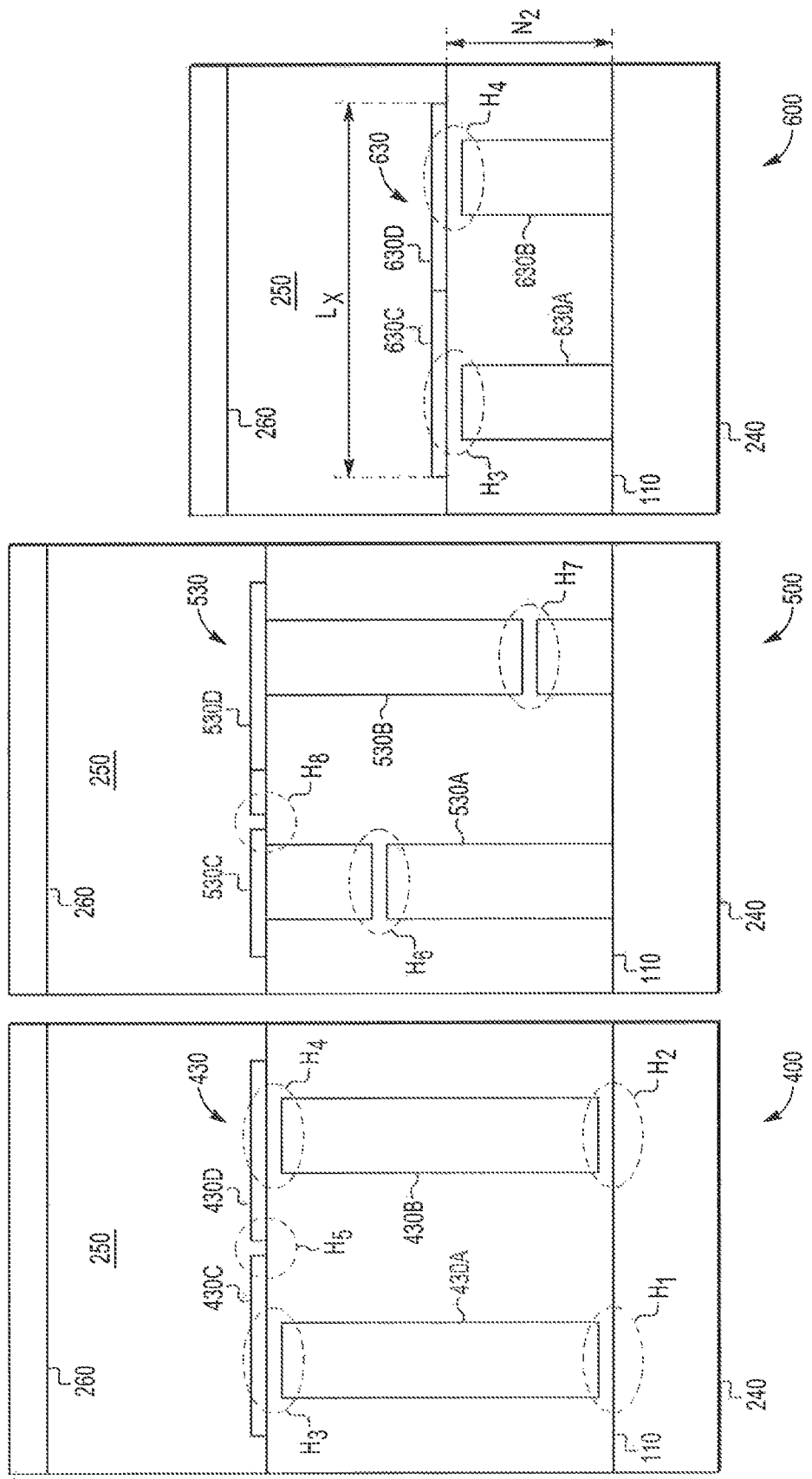

SYSTEM FOR REDUCING ELECTROMAGNETIC INDUCTION INTERFERENCE

FIELD OF THE INVENTION

The present invention relates in general to a system for reducing electromagnetic induction (EMI) interference. In particular it relates to an electromagnetic band gap device located over a ground plane that suppresses EMI interference.

BACKGROUND OF THE INVENTION

When an integrated circuit (IC) is formed over a ground plane, there will be portions of the ground plane where electromagnetic (EM) energy scatters from the transitions caused by geometrical discontinuities and impedance mismatches on the IC. This can cause propagation of EM waves between the IC and the ground plane at certain interfering frequencies. If a radio frequency (RF) device is attached to the IC or operating near the IC, the EM waves caused by this EM energy can interfere with the of that RF device, particularly when the interfering frequencies are near the operating frequencies of the RF device.

For this reason, electromagnetic band gap devices have been designed to suppress and control the EM energy that causes the propagation of EM waves between the IC and the ground plane. An electromagnetic band gap device serves to create a band gap in the frequency spectrum of the propagating electromagnetic waves. This frequency band gap is designed to effectively eliminate interference in a desired frequency range by attenuating the potentially interfering signals to such a degree that they are below a threshold of interference. For example, when a radio or a radar device will be operating near the ground plane, the frequency band gap is provided in the operational frequency range of the radio or radar device.

One way of creating such a frequency band gap is through Sievenpiper electromagnetic band gap devices. Such devices resemble an array of tables formed over a ground plane, each of the tables having a single support rod holding it up.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These figures are not necessarily drawn to scale.

FIG. 4 is a side view of a unit cell in an electromagnetic band gap device according to disclosed embodiments;

FIG. 5 is a side view of a unit cell in an electromagnetic band gap device according to other disclosed embodiments;

FIG. 6 is a side view of a unit cell in an electromagnetic band gap device according to still other disclosed embodiments;

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any mariner the invention. The invention is defined solely by the appended claims including any amendments made during the pendency of this application and an equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Electromagnetic Band Gap Device

As noted above, Sievenpiper electromagnetic band gap devices are conventionally used to suppress and control the EM energy that causes the propagation of EM waves between an IC and a ground plane. However, Sievenpiper electromagnetic band gap devices have the disadvantage in that they require a minimum height. This height is typically around 200 μm for a band gap near 80 GHz. This can be a significant problem when size of a device is an important design parameter, since the minimum height of a Sievenpiper electromagnetic band gap device serves as a limit as to how small the device can be.

It would therefore be desirable to provide on electromagnetic band gap device that could be manufactured to be thinner than a Sievenpiper structure. It would also be desirable for such an electromagnetic band gap device to be easily and cheaply manufactured, but to be capable of being implemented to locate the range of band gap suppression to a desired frequency range for interference suppression.

Figure 1:
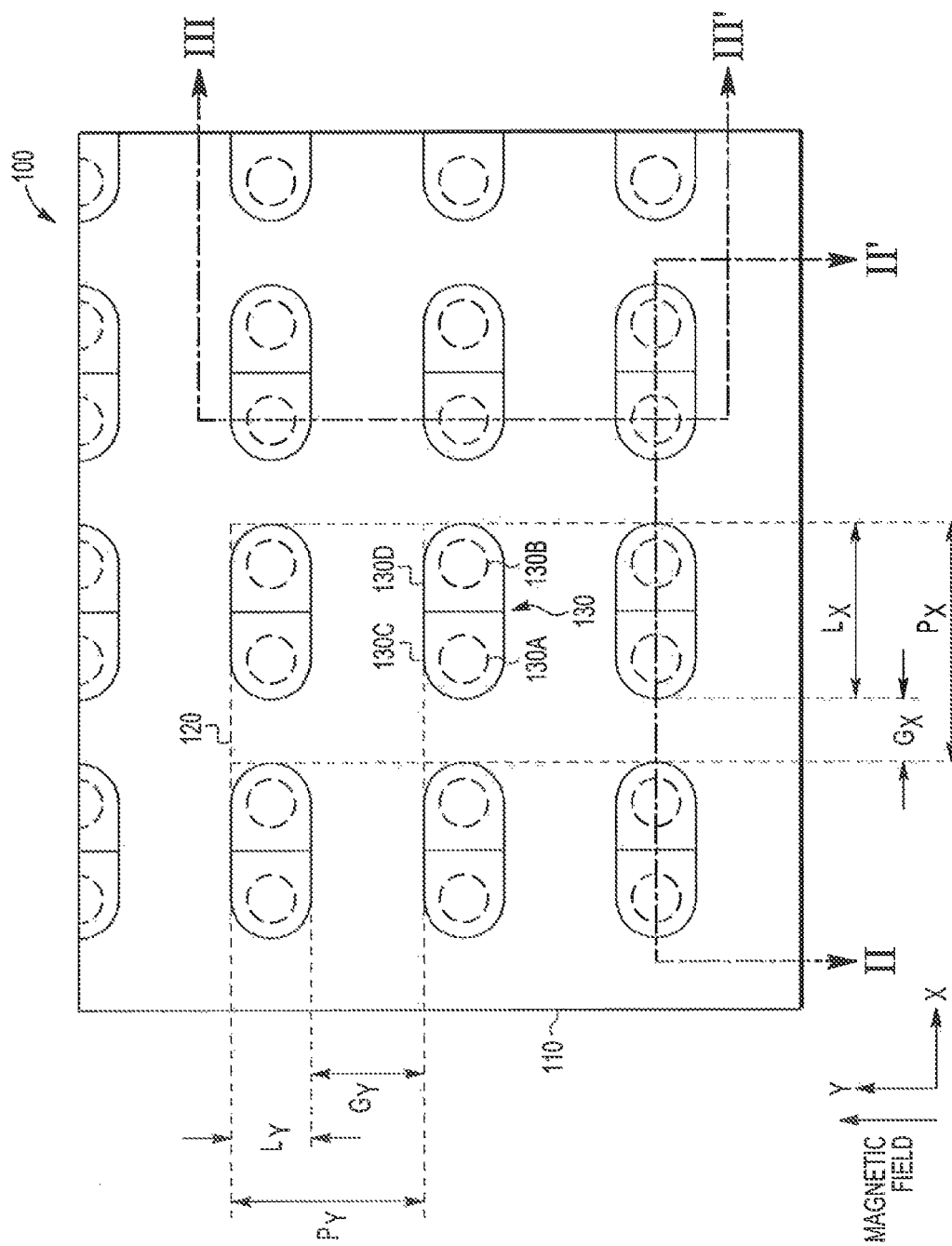
FIG. 1 is an overhead view of an electromagnetic band gap device for reducing EMI interference according to a disclosed embodiment.
Figure 2:
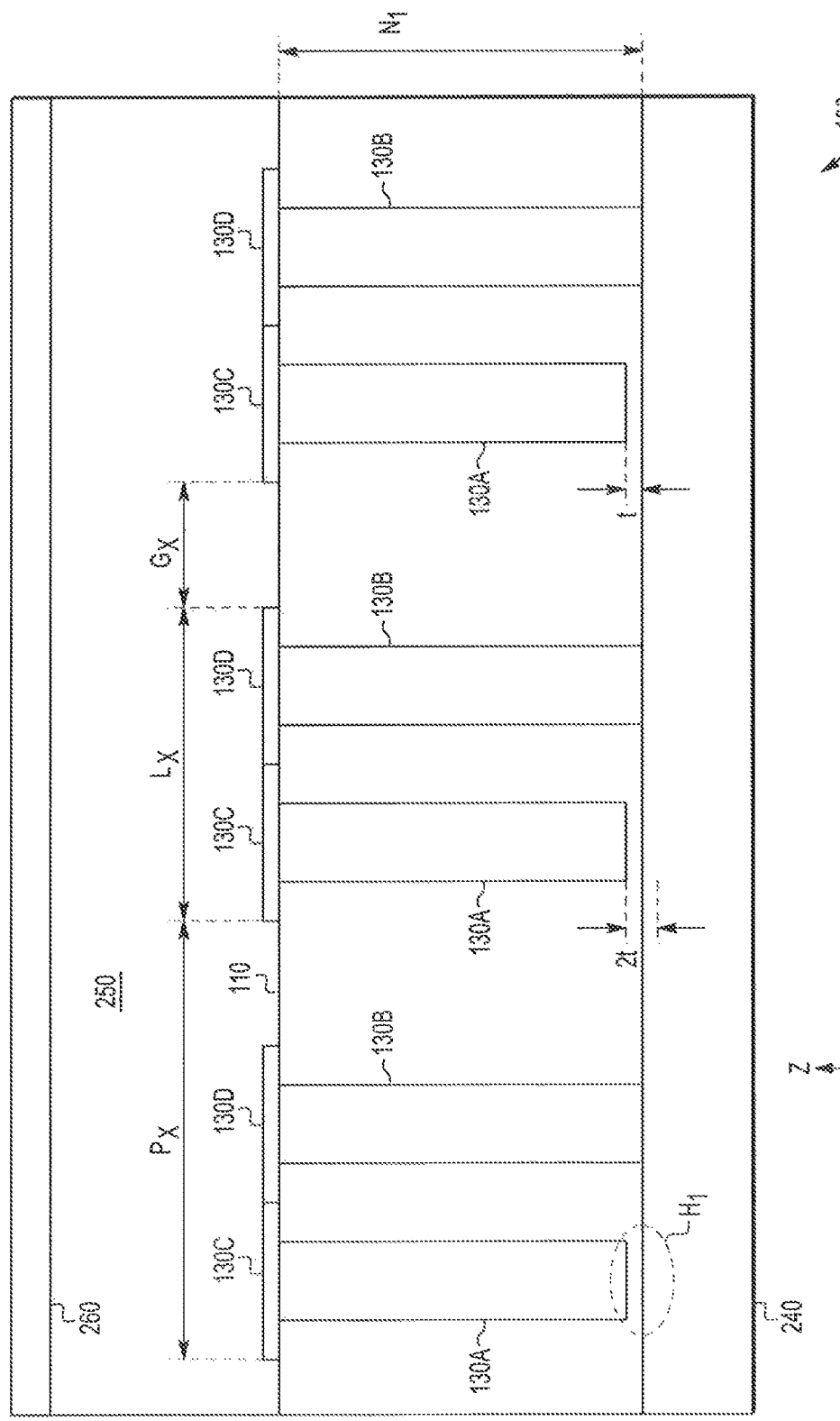
FIG. 2 is a cut-away view of the electromagnetic band gap device of FIG. 1 along the line II-II'.
Figure 3:
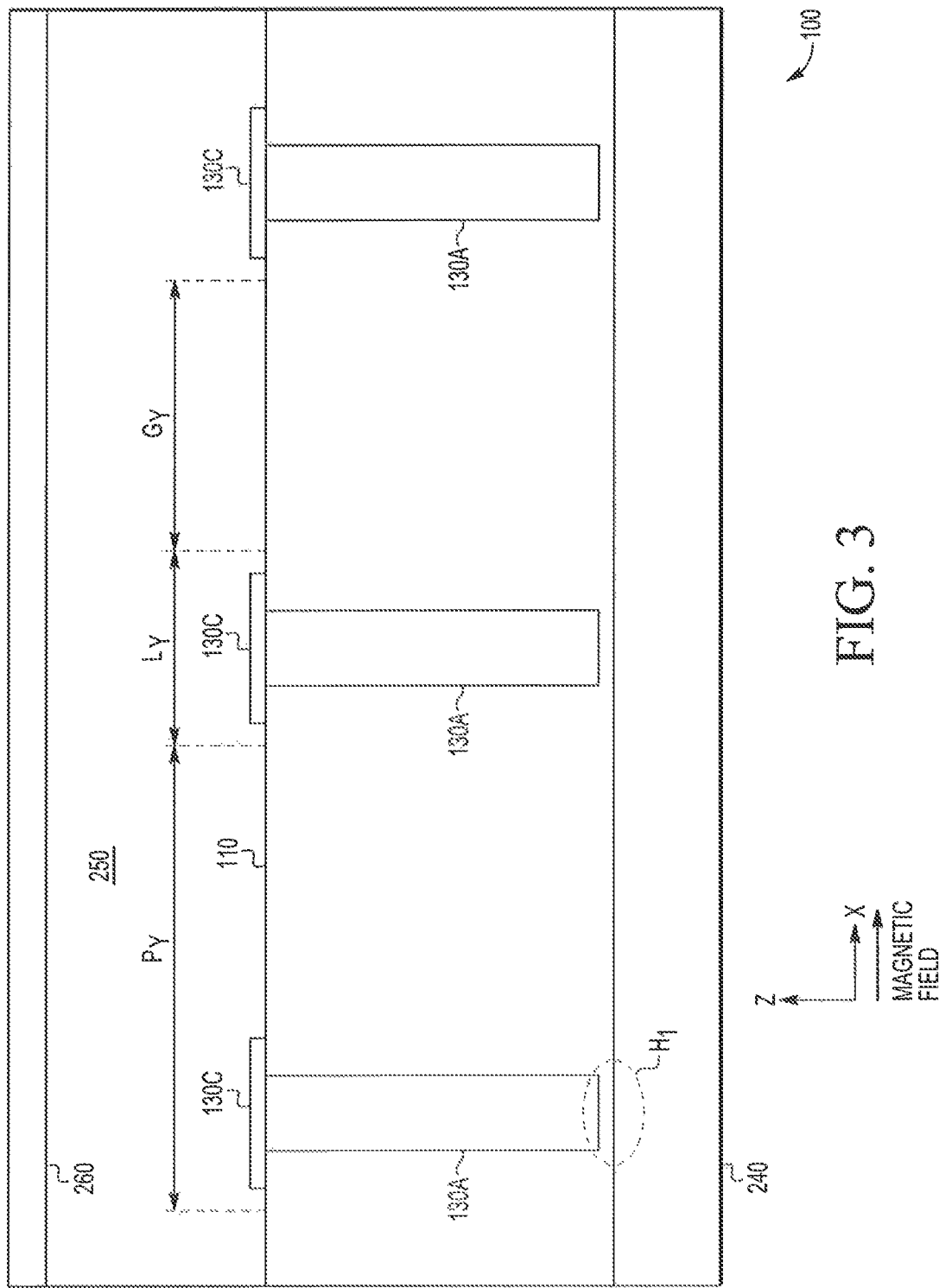
FIG. 3 is a cut-away view of the electromagnetic band gap device of FIG. 1 along the line III-III'.

FIGS. 1 to 3 show an electromagnetic band gap device 100 for reducing electromagnetic induction (EMI) interference according to a disclosed embodiment. FIG. 1 is an overhead view of the electromagnetic band gap device according to the disclosed embodiment. As shown in FIG. 1, an array of unit cells 120 is provided in a non-conductive substrate 110 located above a conductive plane (240 in FIGS. 2 and 3). Each unit cell 120 includes a loop element 130 that is made up of a first via 130A, a second via 130B, a first conductive surface 130C, and a second conductive surface 130D.

The conductive plane 240 has an electromagnetic (EM) field propagating through it in a first direction (the X-direction in FIG. 1), and a magnetic field that is oriented in a second direction (predominately the Y-direction in FIG. 1) perpendicular to the first direction. In the embodiment disclosed in FIG. 1, each of the loop elements 130 in each of the unit cells 120 is oriented such that a line made between the center of a circular cross-section of the first via 130A and the center of a circular cross-section of the second via 130B is in the X-direction (i.e., the direction of the propagation of the EM field). The conductive plane 240 is parallel to the X-Y plane.

The nonconductive layer 110 is an insulating material located over the conductive plane 240, and is used, in part, to insulate the conductive plane 240 from the IC die 260. The non-conductive layer 110 can be made of such materials as dielectrics (e.g., silicon dioxide, silicon nitride, polymers like polyimide, polymers loaded with ceramic, or combinations of layers of the forgoing list of materials or similar materials).

The unit cells 120 are arranged in a regular pattern in the nonconductive layer 110 to fill at least a portion of the nonconductive layer 110. Each unit cell 120 has a loop portion that includes the loop element 130, and an empty portion that includes everything except the loop element 130. The length of a unit cell 120 in the X-direction can be referred to as the pitch in the X-direction, and is represented by the variable $P_X$. The length of a unit cell 120 in the Y-direction can be referred to as the pitch in the Y-direction, and is represented by the variable $P_Y$.

The loop elements 130 are located such that the conductive plane 240, the first and second vias 130A, 130B, and the first and second conductive surfaces 130C, 130D form a magnetic loop in and on the nonconductive layer 110 that couples strongly with the magnetic field in the regions between conductive plane 240 and IC die location represented by plane 260 (i.e. in the layer regions 110 and 250). The largest length of a loop element 130 in the X-direction is represented by the variable $L_X$, while the gap between the loop element 130 and the edge of the unit cell 120 in the X-direction (i.e., the gap between adjacent loop elements 130) is represented by the variable $L_X$. The largest length of a loop element 130 in the Y-direction is represented by the variable $L_Y$, while the gap between the loop element 130 and the edge of the unit cell 120 in the Y-direction (i.e., the gap between adjacent loop elements 130) is represented by the variable $L_Y$. In the embodiment disclosed in FIGS. 1 to 3, the dimensions $L_X$ and $G_X$ are adjusted in conjunction with the adjustment in the gap dimension for a given height $N_1$ of the non-conductive layer 100, i.e., a loop element 130 is produced in the non-conductive layer 110.

The first and second vias 130A, 130B are openings located in the non-conductive layer 110 that are filled with a conductive material such as metal (e.g., copper, aluminum, or any other metal with a high electrical conductivity). The first via 130A extends between the conductive plane 240 and the first conductive surface 130C, while the second via 130B extends between the conductive plane 240 and the second conductive surface 130D.

The first and second conductive surfaces 130C, 130D are located on or over the non conductive layer 110 adjacent to each other. In the embodiment disclosed in FIGS. 1 to 3, the first and second conductive surfaces 130C, 130D each have a half-lozenge-shape, having a semicircular portion and a rectangular portion. The first and second conductive surfaces 130C, 130D are located with their rectangular ends adjacent so that together they form a lozenge-shape. If any gaps are restricted to the vias in non-conductive layer 110, then the sections 130C and 130D will merge into a single lozenge-shape. In this case, sections 130C and 130D will abut against each other, leaving no gap between them.

In the embodiment described in FIGS. 1 to 3, the first and second vias 130A, 130B are cylindrical in shape, i.e. having a circular cross-section in the X-Y plane. (Although the cross-section of the cylinder is not restricted to having circular cross-section, and may have a differently shaped cross-section in other embodiments.) The first and second conductive surfaces 130C, 130D are located over the first and second vias 130A, 130B such that the circular cross-sections of the first and second vias 130A, 130B have the same center point in the X-Y plane as the semicircles in the first and second conductive surfaces 130C, 130D.

The first and second vias 130A, 130B, the first and second conductive surfaces 130C, 130D, and a portion of the conductive plane 240 form an almost continuous loop of conductive material, but for one or more gaps located either in or between the first and second vias 130A, 130B and the first and second conductive surfaces 130C, 130D. These gaps are shown in greater detail in FIGS. 2 to 6.

FIG. 2 is a cut-away view of the electromagnetic band gap device 100 of FIG. 1 along the line II-II', while FIG. 3 is a cut-away view of the electromagnetic band gap device of FIG. 1 along the line III-III'. In particular, FIG. 2 shows a cut-away view of the electromagnetic band gap device 100 in the X-Z plane, where the Z-direction is perpendicular to both the X-direction and the Y-direction, while FIG. 3 shows a cut-away view of the electromagnetic band gap device 100 in the Y-Z plane.

As shown in FIGS. 2 and 3, the non-conductive layer 110 is located over the conductive plane 240, while the loop elements 130 are located in and on the non-conductive layer 110. An integrated circuit (IC) die 260 is located above the non-conductive layer 110, separated from the non-conductive layer 110 by a non-conductive gap 250.

The conductive plane 240 is located of a conductive material such as a conductive metal (e.g., copper, aluminum, or any other electrically conductive material with a high electrical conductivity). This conductive plane 240 is used as a ground plane for an IC device formed on the IC die 260.

The non-conductive gap 250 can be formed of any suitable filling that does not conduct electricity. For example, it could be a dielectric material, a gaseous material, a vacuum, or any other suitable material. As shown in FIG. 2, the non-conductive gap 250 comprises a solid dielectric. However, alternate embodiments can use a non-conductive gas as the non-conductive gap 250. If the non-conductive gap 250 is a gaseous material or vacuum, supports will be located either on or adjacent to the array of unit cells 120 to support the IC die 260.

In the disclosed embodiment, the IC die 260 contains an integrated circuit that uses the conductive plane 240 as a ground plane. In other embodiments, the IC die 260 may include a radio frequency (RF) element that transmits and/or receives radio waves, such as a radio transmitter or receiver, a radar transmitter or receiver, or the like.

In this disclosed embodiment, the first and second vias 130A, 130B, the first and second conductive surfaces 130C, 130D, and a portion of the conductive plane 240 form an almost continuous loop of conductive material, but for a first gap $H_1$ located between the first via 130A and the conductive plane 240. The first gap $H_1$ has a width of t. However, since the first gap $H_1$ is located adjacent to the conductive plane 240, it has an effective gap length of 2 t, because of an image of the first gap $H_1$ that will be located in the conductive plane 240.

Since the conductive plane 240 is used as ground plane for an IC device located on the IC die 260, the first gap $H_1$ in each loop element 130 will cause the EM transmissions emanating from the conductive plane 240 to have a null frequency band, i.e., a frequency band in which interfering signals from the conductive plane fall below a set threshold power. The precise location of the null frequency band is determined by the location of the first gap $H_1$, the width t of the gap first $H_1$, the dimensions of the unit cell 120 and the loop element 130 (i.e., $P_X$, $L_X$, $G_X$, $P_Y$, $L_Y$, and $G_Y$). These parameters can be altered as needed to get a null frequency band with a desired location and a desired frequency width. In some embodiments, G can vary from 100-200 µm, and $P_Y$ can vary from 100-500 µm, with corresponding values for $P_X$, $L_X$, $L_Y$, and $G_Y$. However, these ranges are simply by way of example, Larger or smaller values of $G_X$ and $P_Y$ may be used.

In electronic terms, each loop element 130 operates as an LC resonant circuit, in conjunction with the conductive plane 240. The resonant frequency of the loop element 130 will depend on the parameters of the loop element 130 (e.g., $L_X$, $L_Y$, the shape of the first and second conductive layers 130C, 130D, the number of gaps used, the position of the gaps, etc.)

Alternate Disclosed Embodiments

Numerous alternate embodiments will be described below. In each embodiment, similar numbers will represent the same elements. Where such elements are not named, they operate as described above with respect to comparable elements in the embodiment disclosed in FIGS. 1 to 3.

Although a single gap $H_1$ is disclosed in the disclosed embodiment of FIGS. 1 to 3, alternate embodiments could include multiple gaps. Furthermore, these gaps can be located anywhere within the loop element 130. FIGS. 4 and 5 are side views of a unit cell 430, 530 in an electromagnetic band gap device according to alternate disclosed embodiments. These alternate disclosed embodiments use different gap numbers and locations.

FIG. 4 is a side view of a unit cell in an electromagnetic band gap device 400. As shown in FIG. 4, five gaps are used in this electromagnetic band gap device 400. A first gap $H_1$ is located between the conductive plane 240 and a first via 430A; a second gap $H_2$ is located between the conductive plane 240 and a second via 430B; a third gap $H_3$ is located between the first via 430A and a first conductive layer 430C; a fourth gap $H_4$ is located between the second via 430B and a second conductive layer 430D; and a fifth gap $H_5$ is located between the first conductive layer 430C and the second conductive layer 430D. Alternate embodiments could employ any one or more of these gaps $H_1$, $H_2$, $H_3$, $H_4$, $H_5$.

FIG. 5 is a side view of a unit cell in an electromagnetic band gap device 500. As shown in FIG. 5, three gaps are used in this electromagnetic band gap device 500. However, these gaps are located not at intersections between vias 530A, 530B and the conductive plane 240; not between a via 530A, 530B and a corresponding conductive layer 530C, 530D; and not at an intersection of the conductive layers 530C, 530D. Rather, the gaps in this device 500 are located within a via 530A, 530B, or within a conductive layer 530C. In particular, a sixth gap $H_6$ is located within the first via 530A; a seventh gap $H_7$ is located within the second via 530B; and an eighth gap $H_8$ is located in the first conductive layer 530C. Alternate embodiments could use more or fewer gaps, and could place the gaps anywhere within the vias 530A, 530B or conductive layers 530C, 530D.

It is also possible in alternate embodiments to use a gap within a part of a loop element, and a gap at an intersection of parts of the loop element. For example, an embodiment might employ the first gap $H_1$ and the seventh gap $H_7$. Any other combination of gap location and gap number is possible.

In addition, although the embodiments disclosed in FIGS. 1 to 5 are shown as having the non-conductive layer 110 having a height $N_1$ that is larger $L_X$ or $L_Y$, alternate embodiments could vary the height of the non-conductive layer 110. In particular, the height of the non-conductive layer 110 can be reduced below 100 um for an EBG structure with a stop band near 80 GHz. FIG. 6 is a side view of a unit cell in an electromagnetic band gap device 600 according to still other disclosed embodiments.

As shown in FIG. 6, a height $N_2$ of the non-conductive layer 610 is smaller than the value $L_X$. Furthermore, since this embodiment uses the same shape as FIGS. 1 to 3 for the first and second conductive layers 630C, 630D, $L_X$ is greater than $L_Y$, meaning that $N_2$ is also smaller than $L_Y$. In this particular embodiment, $N_2$ is typically less than 200 um for a Sievenpiper EBG structure.

Figure 7:
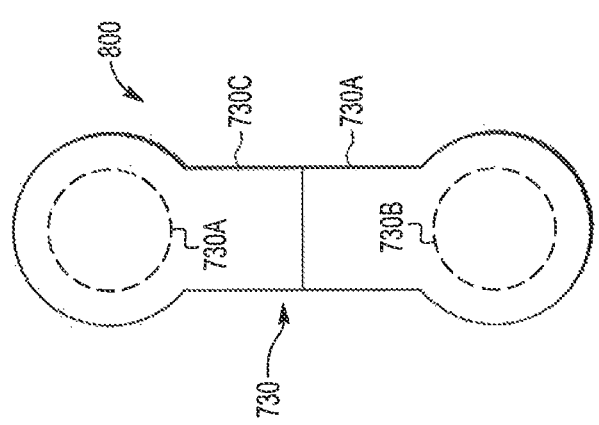
FIG. 7 is an overhead view of a loop element in an electromagnetic band gap device according to yet other disclosed embodiments.

Furthermore, although FIGS. 1 to 3 disclose the use of first and second conductive surfaces 130C, 130D that together form a lozenge shape, the precise shape of first and second conductive surfaces in a loop element can be varied in alternate embodiments. FIG. 7 is an overhead view of a loop element 730 in an electromagnetic band gap device 700 according to yet another disclosed embodiment. As shown in FIG. 7, the first and second conductive surfaces 730C, 730D, which form the top of the loop element 730, together form a barbell shape. However, this is merely by way of example, to demonstrate that alternate shapes can be used. First and second conductive surfaces in a loop element can be provided in numerous other shapes, so long as they can be properly connected to the vias in the loop element to interact properly with the magnetic field H in the conductive plane 240.

Furthermore, although FIGS. 1 to 3 disclose the use of two conductive surfaces (first and second conductive surfaces 130C, 130D) that together form a lozenge shape, along with two vias (first and second vias 130A, 130B), alternate embodiments could employ more than two conductive surfaces and more than two vias. Embodiments with more vias will simply form additional loops with the conductive plane 240.

Figure 8:
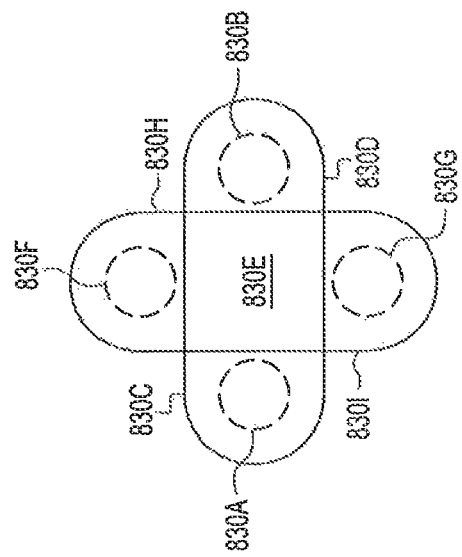
FIG. 8 is an overhead view of a loop element in an electromagnetic band gap device according to still other disclosed embodiments.

FIG. 8 is an overhead view of a loop element 830 in an electromagnetic band gap device 800 according to still another disclosed embodiment. In particular, FIG. 8 illustrates a method to achieve attenuation in more than one direction within the plane of propagation. As shown in FIG. 8, a loop element 830 includes four vias (830A, S30B, 830C, 830D), and five conductive layers (830E, 830F, 830G, 830H, 830I). The four vias are arranged such that the first and second vias 830A, 830B form a first line, and third and fourth vias 830C, 830D form a second line perpendicular to the first line. The five conductive layers are configured such that they form a shape of two overlapping lozenges. However, this is merely by way of example, to demonstrate that alternate numbers of vias, with corresponding different numbers and shapes of conductive layers can be used. Alternate embodiments can use different numbers of vias, including odd numbers that are greater than 1.

Although not shown in FIG. 8, gaps would be located in one or more of the vias 830A, 830B, 830C, 830D of the loop element 830, as noted above with respect to the embodiments of FIGS. 1-7.

In addition, although the embodiment disclosed in FIGS. 1 to 3 places the two vias 130A, 130B such that the center points of their circular cross-sections form a line in the X-direction (i.e., the direction of EM field propagation), alternate embodiments could form the unit cells 120 and the loop elements 130 such that they had some rotation in the X-Y plane (i.e., they were rotated around a center point such that they were not entirely parallel with a line formed in the X-direction). In other words, the center points of the circular cross-sections of the two vias 130A, 130B could form a line that was some number of degrees rotated with respect to the X-direction.

Furthermore, although the embodiment disclosed in FIGS. 1 to 3 repeats the unit cells 120 and loop elements 130 using "perfect spacing" (i.e., $P_X$ and $P_Y$ are constant for each unit cell), it is possible to add some small randomness to the spacing between loop elements 130. Alternate embodiments could add some small randomness to the length of the unit cells 120 in the X-direction, the Y-direction, or both. This could be accomplished by making a length of a unit cell 120 in the X-direction equal to $P_X$+/− a random variance, and/or making a length of a unit cell 120 in the Y-direction equal to $P_Y$+/− a random variance. Assuming $L_X$ and $L_Y$ remain constant, this would have the effect of altering the one or both of $G_X$ and $G_Y$. In other words, a small randomness could be added to the gap between adjacent loop elements 130 in the X-direction, the Y-direction, or both. Adding such randomness would broaden the attenuation in frequency of the electromagnetic band gap device at the expense of sacrificing its maximum attenuation.

Frequency Nulls in an Antenna Using an Electromagnetic Band Gap Device

Figure 9:
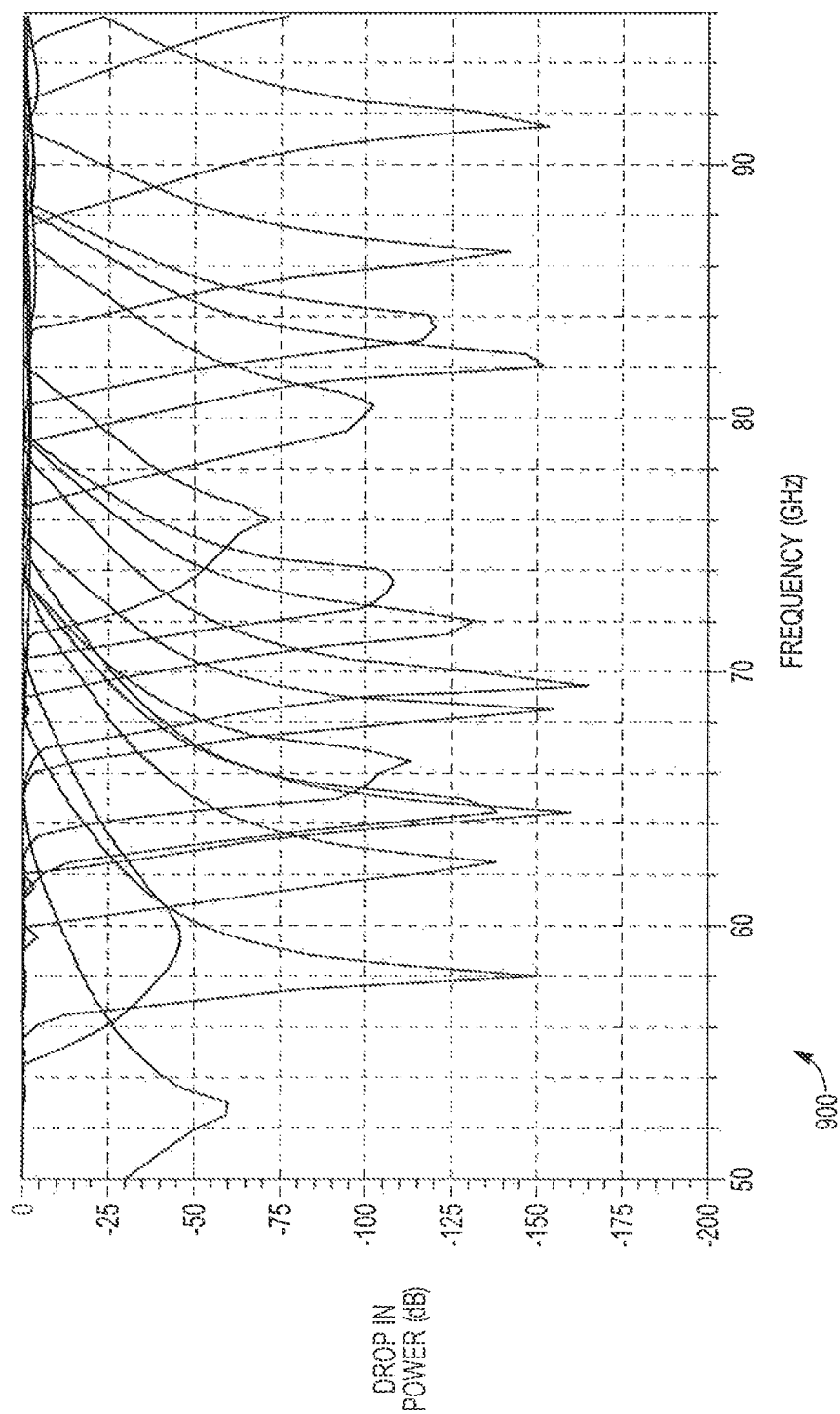
FIG. 9 is a graph of electromagnetic band gap (EBG) suppression where the electromagnetic band gap frequency range is controlled by gap number, gap location, and unit cell parameters in an electromagnetic band gap device according to various embodiments.

FIG. 9 is a graph of multiple sets of EBG attenuation responses 900 controlled by gap number, gap location, and unit cell parameters in an electromagnetic band gap device according to various disclosed embodiments. Each line in the graph of EBG suppression (i.e., attenuation) 900 represents a different set of parameters for gap number, gap location, and in it cell parameters. As shown in FIG. 9, by manipulating these values, it is possible to create a wide variety of EBG suppression responses with a variety of different suppression and frequency response band gaps (i.e., widths of suppression in a frequency range).

Method of Making an Electromagnetic Band Gap Device

Figure 10:
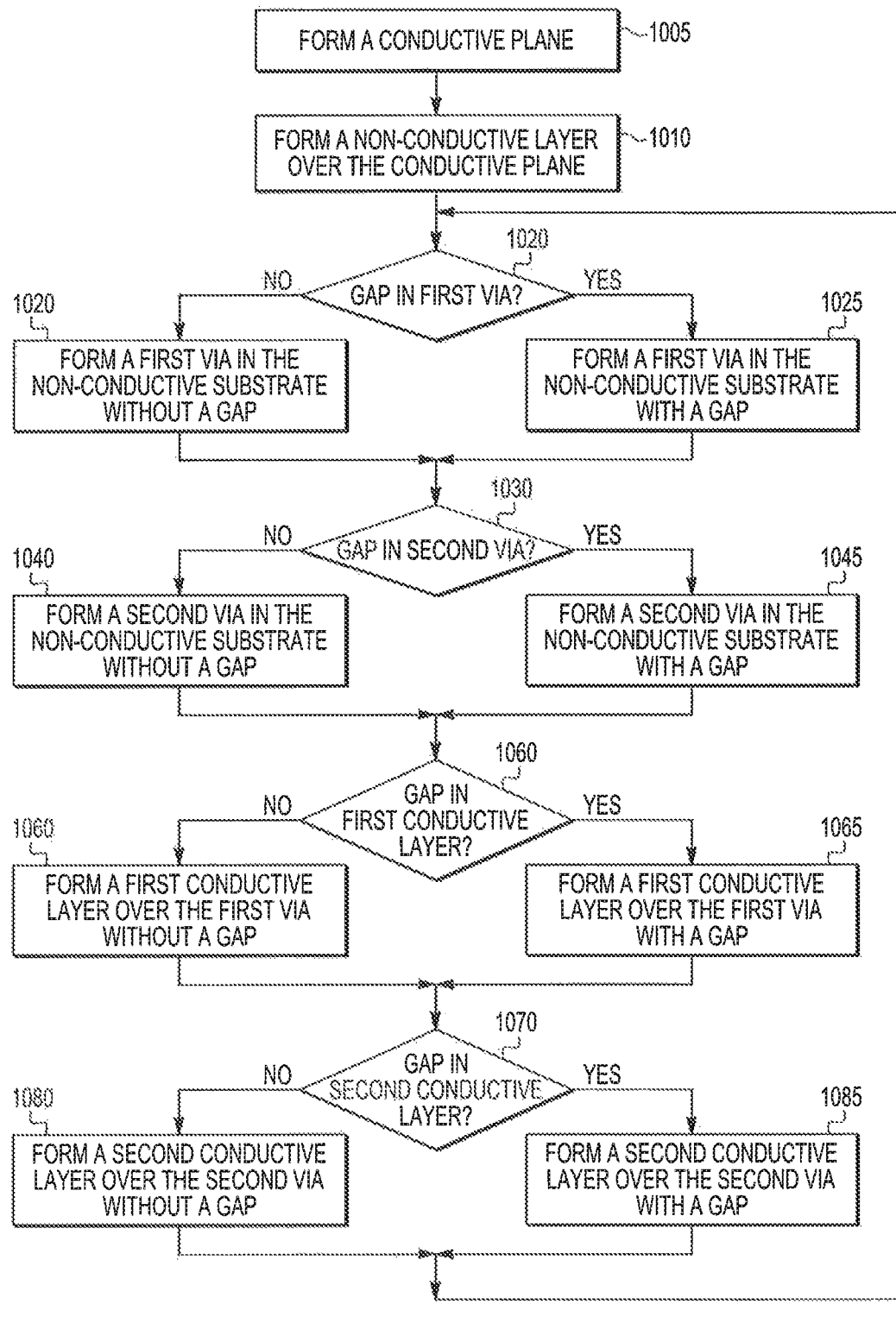
FIG. 10 is a flowchart of a method of manufacturing an electromagnetic band gap device according to disclosed embodiments.

FIG. 10 is a flowchart of a method 1000 of manufacturing a loop element in an electromagnetic band gap device according to disclosed embodiments. As shown in FIG. 10, the method 1000 begins by forming a conductive plane (1005). As noted above, this conductive plane can be made out of metal, or any other electrically conductive material. This can include metals, semi-metals, and semiconductors, though materials with lower electrical conductivities would provide a broader frequency band gap with lower suppression.

A non-conductive layer is formed over the conductive plane (1010). As noted above, this non-conductive layer can be made of a dielectric material, or any other solid material that does not conduct electricity.

Although operations 1005 and 1010 show first forming a conductive plane and then forming a non-conductive layer formed over the conductive plane, this could be reversed in alternate embodiments. In such embodiments a non-conductive layer could be formed first, and a conductive plane could then be formed over the non-conductive layer.

It is then determined whether there will be a gap in a first via (1015). If no gap is to be formed in the first via, the first via is formed in the nonconductive layer without a gap (1020). If, however, a gap is to be formed in the first via, the first via is formed in the non-conductive layer with a gap (1025).

It is then determined whether there will be a gap in a second via (1030). If no gap is to be formed in the second via, the second via is formed in the non-conductive layer without a gap (1040). If, however, a gap is to be formed in the second via, the second via is formed in the non-conductive layer with a gap (1045).

In each of these two operations, the vias can be formed and filled using any acceptable process. For example, in various embodiments the vias could be formed by drilling or etching. In various embodiments, these two processes can be performed sequentially or at the same time.

It is then determined whether there will be a gap in a first conductive layer (1050). If no gap is to be formed in the first conductive layer, the first conductive layer is formed over the first via without a gap (1060). If, however, a gap is to be formed in the first conductive layer, the first conductive layer is formed over the first via with a gap (1065).

Finally, it is determined whether there will be a gap in a second conductive layer (1070). If no gap is to be formed in the second conductive layer, the second conductive layer is formed over the second via without a gap (1080). If, however, a gap is to be formed in the second conductive layer, the second conductive layer is formed over the second via with a gap (1085).

In each of these two operations, the conductive layers can be formed using any acceptable process. For example, in various embodiments the vias could be formed by physical vapor deposition (PVD), chemical vapor deposition (CVD), electrochemical deposition (ECD), molecular beam epitaxy (MBE), atomic layer deposition (ALE)), or the like. In various embodiments, these two processes can be performed sequentially or at the same time.

The first and second vias and the first and second conductive layers are formed out of a conductive material, such as copper, aluminum, or conductive epoxy (e.g., an epoxy loaded with silver particles).

Passing through this method once will create a single loop element over a conductive plane. However, operations 1015 through 1085 can then be repeated, as necessary, to create on array of loop elements over the conductive plane. In such a case, it is necessary to move to a new location each time operations 1015 through 1085 are carried out. In various embodiments, the multiple iterations of this method can be performed sequentially or at the same time.

In the above method, a gap in a via can refer to: a gap at an internal portion of a via; a gap at an intersection of a via and the conductive plane; or a gap at an intersection of a via and a conductive layer. Similarly, a gap in a conductive layer can refer to: a gap at an internal portion of a conductive plane; a gap at an intersection of a via and a conductive layer; or a gap between the conductive layers. Furthermore, although operations 1015, 1030, 1050, and 1070 to determine whether a gap is required in a given element, and operations 1025, 1045, 1065, and 1085 all indicate forming an element with a gap, these operations can easily be applied to situations in which multiple gaps are to be formed in a given element.

A device is provided, comprising: a conductive plane configured to propagate electro-magnetic fields in a first direction, and to have a magnetic field in a second direction perpendicular to the first direction; a non-conductive substrate located over the conductive plane; and an electromagnetic band gap unit cell, the electromagnetic band gap unit cell including a first via located in the non-conductive substrate, the first via being filled with a conductive material, a second via located in the non-conductive substrate, the second via being filled with the conductive material, a first conductive surface located on the non-conductive substrate over the first via, and a second conductive surface located on the non-conductive substrate over the second via, wherein the first and second vias are arranged to form a line in the first direction, the electromagnetic band gap unit cell is configured to operate as an LC resonant circuit in conjunction with the conductive plane, wherein at least one gap is located in the electromagnetic band gap unit cell, the at least one gap being located: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

The non-conductive layer may comprise a non-conductive dielectric material. The non-conductive gap may comprise one of: air, vacuum, or a non-conductive dielectric material.

The at least one electromagnetic band gap unit cell may comprise a plurality of electromagnetic band gap unit cells arranged in the first direction to form an electromagnetic band gap cell row. The at least one electromagnetic band gap unit cell may comprise a plurality of electromagnetic band gap unit cells arranged in an array having rows extending in the first direction and columns extending in the second direction to form an electromagnetic band gap cell array.

The device may further comprise: a top layer located over the non-conductive layer, wherein a non-conductive gap is located between the non-conductive layer and the top layer.

The device, wherein each individual electromagnetic band gap unit cell in the electromagnetic band gap unit cell row has an orientation that differs from a reference line by a random angular difference around a center point of the individual electromagnetic band gap unit cell.

A plurality of gaps may be located in the electromagnetic band gap unit cell, the plurality of gaps being located in at least two of: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

The non-conductive substrate may have a thickness under 200 µm.

An array is provided, comprising: a conductive plane configured to propagate electro-magnetic fields in a first direction, and to have a magnetic field in a second direction perpendicular to the first direction; a non-conductive substrate located over the conductive plane; and a plurality of electromagnetic band gap cells located in a regular array in the non-conductive substrate, wherein each electromagnetic band gap unit cell includes a first via located in the non-conductive substrate, the first via being filled with a conductive material, a second via located in the non-conductive substrate, the second via being fined with the conductive material, a first conductive surface located on the non-conductive substrate over the first via, and a second conductive surface located on the non-conductive substrate over the second via, the first and second vias are arranged to form a line in the first direction, the electromagnetic band gap unit cell is configured to operate as an LC resonant circuit in conjunction with the conductive plane, at least one gap is located in the electromagnetic band gap unit cell, and the at least one gap being located: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

A first group of electromagnetic band gap unit cells from among the plurality of electromagnetic band gap unit cells may have at least one gap located according to a first configuration, and a second group of electromagnetic band gap unit cells from among the plurality of electromagnetic band gap unit cells may have at least one gap located according to a second configuration that is different from the first configuration.

The non-conductive gap may comprise one of: air, vacuum, or a non-conductive dielectric material. The non-conductive substrate may have a thickness under 200 µm.

The array may further comprise: a top layer located over the non-conductive layer, wherein a non-conductive gap is located between the non-conductive layer and the top layer.

In each electromagnetic band gap cell, a plurality of gaps may be located in the electromagnetic band gap unit cell, the plurality of gaps being located in at least two of: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

A method of making an electromagnetic band gap device is provided, comprising: forming a conductive plane; forming a non-conductive substrate over the conductive plane; forming a first via in the non-conductive substrate, the first via being filled with a conductive material; forming a second via in the non-conductive substrate, the second via being filled with the conductive material; forming a first conductive surface on the non-conductive substrate over the first via; forming a second conductive surface on the non-conductive substrate over the second via; and forming at least one gap either between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane, wherein the first and second vias are arranged to form a line in the first direction, the first via, the second via, the first conductive surface, and the second conductive surface form an electromagnetic band gap unit cell, and the electromagnetic band gap unit cell is configured to operate as an LC resonant circuit in conjunction with the conductive plane.

The non-conductive gap may comprise one of: air, vacuum, or a non-conductive dielectric material.

The operations of forming the first via, forming the second via, forming the first conductive surface, and forming the second conductive surface on the nonconductive substrate over the second via may be repeated a plurality of times to form a row of electromagnetic band gap cells. In the operation of forming the second via, the second via may be formed such that a line between the center of the first via and the center of the second via is rotated a random angular amount with respect to a reference line. The operations of forming a first via, forming a second via, forming a first conductive surface, and forming a second conductive surface on the nonconductive substrate over the second via may be repeated a plurality of times to form an array of electromagnetic band gap cells.

When the operations of forming a first via, forming a second via, forming a first conductive surface, and forming a second conductive surface on the nonconductive substrate over the second via are repeated a plurality of times, the repetitions may be conducted at the same time as each other.

The method may further comprise forming a plurality of gaps in at least two of: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

The nonconductive substrate may be formed to have a thickness under 200 μm.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A device, comprising:
   a conductive plane configured to propagate electro-magnetic fields in a first direction, and to have a magnetic field in a second direction perpendicular to the first direction;
   a non-conductive substrate located over the conductive plane; and
   at least one electromagnetic band gap unit cell, the at least one electromagnetic band gap unit cell including
      a first via located in the non-conductive substrate, the first via being filled with a conductive material,
      a second via located in the non-conductive substrate, the second via being filled with the conductive material,
      a first conductive surface located on the non-conductive substrate over the first via, and
      a second conductive surface located on the non-conductive substrate over the second via,
   wherein
   the first and second vias are arranged to form a line in the first direction,
   the at least one electromagnetic band gap unit cell is configured to operate as an LC resonant circuit in conjunction with the conductive plane,
   wherein at least one gap is located in the at least one electromagnetic band gap unit cell, the at least one gap being located: between the conductive plane and the first via, in the first via, between the first via and the first conductive surface, in the first conductive surface, in the second conductive surface, between the second conductive surface and the second via, in the second via, or between the second via and the conductive plane.

2. The device of claim 1, wherein the non-conductive layer comprises a non Conductive dielectric material.

3. The device of claim 1, wherein the gap is a non-conductive gap that comprises one of:
   air, vacuum, or a non-conductive dielectric material.

4. The device of claim 1, wherein the at least one electromagnetic band gap unit cell comprises a plurality of electromagnetic band gap unit cells arranged in the first direction to form an electromagnetic band gap cell row.

5. The device of claim 1, wherein the at least one electromagnetic band gap unit cell comprises a plurality of electromagnetic band gap unit cells arranged in an array having rows extending in the first direction and columns extending in the second direction to form an electromagnetic band gap cell array.

6. The device of claim 4, further comprising:
   a top layer located over the non-conductive layer, wherein
   a non-conductive gap is located between the non-conductive layer and the top layer.

7. The device of claim 4, wherein each individual electromagnetic band gap unit cell in the electromagnetic band gap unit cell row has an orientation that differs from a reference line by a random angular difference around a center point of the individual electromagnetic band gap unit cell.

8. The device of claim 1, wherein the at least one gap is located: between the first via and the first conductive surface, between the first conductive surface and the second conductive surface, or between the second conductive surface and the second via, in the second via.

9. The device of claim 1, further wherein a plurality of gaps are located in the electromagnetic band gap unit cell, the plurality of gaps being located in at least two of: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

10. The device of claim 1, wherein the non-conductive substrate has a thickness under 200 μm.

11. An array, comprising:
    a conductive plane configured to propagate electro-magnetic fields in a first direction, and to have a magnetic field in a second direction perpendicular to the first direction;
    a non-conductive substrate located over the conductive plane; and
    a plurality of electromagnetic band gap cells located in a regular array in the non-conductive substrate,
    wherein
    each electromagnetic band gap unit cell includes
       a first via located in the non-conductive substrate, the first via being filled with a conductive material,
       a second via located in the non-conductive substrate, the second via being filled with the conductive material,
       a first conductive surface located on the non-conductive substrate over the first via, and
       a second conductive surface located on the non-conductive substrate over the second via,
    the first and second vias are arranged to form a line in the first direction,
    each electromagnetic band gap unit cell is configured to operate as an LC resonant circuit in conjunction with the conductive plane, and
    at least one gap is located in each electromagnetic band gap unit cell, the at least one gap being located in at least one of the group consisting of: between the conductive plane and the first via, in the first via, between the first via and the first conductive surface, in the first conductive surface, in the second conductive surface, between the second conductive surface and the second via, in the second via, or between the second via and the conductive plane.

12. The array of claim 11, wherein
a first group of electromagnetic band gap unit cells from among the plurality of electromagnetic band gap unit cells have at least one gap located according to a first configuration, and
a second group of electromagnetic band gap unit cells from among the plurality of electromagnetic band gap unit cells have at least one gap located according to a second configuration that is different from the first configuration.

13. The array of claim 11, wherein the gap is a non-conductive gap that comprises one of:
air, vacuum, or a non-conductive dielectric material.

14. The array of claim 11, wherein the non-conductive substrate has a thickness under 200 μm.

15. The array of claim 14, further comprising:
a top layer located over the non-conductive layer, wherein
a non-conductive gap is located between the non-conductive layer and the top layer.

16. The array of claim 11, further wherein in each electromagnetic band gap cell, a plurality of gaps are located in the electromagnetic band gap unit cell, the plurality of gaps being located in at least two of the group consisting of: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

17. A method of making a device, comprising:
forming a conductive plane;
forming a non-conductive substrate;
forming a first via in the non-conductive substrate, the first via being filled with a conductive material;
forming a second via in the non-conductive substrate, the second via being filled with the conductive material;
forming a first conductive surface on the non-conductive substrate over the first via;
forming a second conductive surface on the non-conductive substrate over the second via; and
forming at least one gap either between the conductive plane and the first via, in the first via, between the first via and the first conductive surface, in the first conductive surface, in the second conductive surface, between the second conductive surface and the second via, in the second via, or between the second via and the conductive plane,
wherein
the non-conductive substrate is located adjacent to the conductive plane,
the first and second vias are arranged to form a line in a first direction,
the first via, the second via, the first conductive surface, and the second conductive surface form an electromagnetic band gap unit cell, and
the electromagnetic band gap unit cell is configured to operate as an LC resonant circuit in conjunction with the conductive plane.

18. The method of claim 17, wherein the gap is a non-conductive gap that comprises one of the group consisting of: air, vacuum, or a non-conductive dielectric material.

19. The method of claim 17, wherein the operations of forming the first via, forming the second via, forming the first conductive surface, and forming the second conductive surface on the non-conductive substrate over the second via are repeated a plurality of times to form a row of electromagnetic band gap cells.

20. The method of claim 19, when the operations of forming the first via, forming the second via, forming the first conductive surface, and forming the second conductive surface on the non-conductive substrate over the second via are repeated a plurality of times, the repetitions are conducted at the same time as each other.

21. The method of claim 19, wherein in the operation of forming the second via, the second via is formed such that a line between the center of the first via and the center of the second via is rotated a random angular amount with respect to a reference line.

22. The method of claim 17, wherein the operations of forming a first via, forming a second via, forming a first conductive surface, and forming a second conductive surface on the non-conductive substrate over the second via are repeated a plurality of times to form an array of electromagnetic band gap cells.

23. The method of claim 22, when the operations of forming a first via, forming a second via, forming a first conductive surface, and forming a second conductive surface on the non-conductive substrate over the second via are repeated a plurality of times, the repetitions are conducted at the same time as each other.

24. The method of claim 17, further comprising forming a plurality of gaps in at least two of: between the conductive plane and the first via, in the first via, between the first via and the first conductive surface, in the first conductive surface, between the first conductive surface and the second conductive surface, in the second conductive surface, between the second conductive surface and the second via, in the second via, or between the second via and the conductive plane.

25. The method of claim 17, wherein the non-conductive substrate is formed to have a thickness under 200 μm.

* * * * *